United States Patent [19]
Simmonet

[11] Patent Number: 5,914,502
[45] Date of Patent: Jun. 22, 1999

[54] ASSEMBLY OF THYRISTORS HAVING A COMMON CATHODE

[75] Inventor: Jean-Michel Simmonet, Tours, France

[73] Assignee: SGS-Thomson Microelectronics S.A., Saint Genis, France

[21] Appl. No.: 08/890,243

[22] Filed: Jul. 10, 1997

[30] Foreign Application Priority Data

Jul. 12, 1996 [FR] France .................................. 96/08972

[51] Int. Cl.$^6$ ........................ H01L 29/74; H01L 31/111
[52] U.S. Cl. ........................ 257/107; 257/154; 257/177
[58] Field of Search ................... 257/107, 132, 257/177, 154

[56] References Cited

U.S. PATENT DOCUMENTS

| | | | |
|---|---|---|---|
| 3,644,800 | 2/1972 | Igarashi . | |
| 4,032,958 | 6/1977 | Yagi et al. | 357/37 |
| 5,365,086 | 11/1994 | Pezzani | 257/157 |

FOREIGN PATENT DOCUMENTS

A-0 709 891  5/1996  European Pat. Off. ........ H01L 27/07

OTHER PUBLICATIONS

Patent Abstracts of Japan, vol. 8, No. 13 (E–222), Jan. 20, 1984 & JP–A–58 176972 (Nippon Denki).
Patent Abstracts of Japan, vol. 4, No. 4 (E–164), Jan. 12, 1980 & JP–A–54 144887 (Mitsubishi Denki).
Patent Abstracts of Japan, vol. 7, No. 33 (E–157), Feb. 9, 1983 & JP–A–57 186365 (Nippon Denki).
Patent Abstracts of Japan, vol. 1, No. 152 (E–71), Dec. 7, 1977 & JP–A–52 091659 (Toshiba Corp.).
Patent Abstracts of Japan, vol. 10, No. 201 (E–419), Jul. 15, 1986 & JP–A–61 044464 (Toshiba Corp.).

*Primary Examiner*—Ngân V. Ngô
*Attorney, Agent, or Firm*—Wolf, Greenfield & Sacks, P.C.

[57] ABSTRACT

A monolithic assembly of thyristors having a common cathode and a single gate includes a lightly-doped substrate, several anode regions, on the front surface side, a cathode gate layer on the rear surface side of the substrate, a cathode layer on the rear surface side of the layer coated with a cathode metallization, a well extending from the front surface to the layer, a gate metallization formed on the upper surface of the well, and means for increasing the leakage resistance between the cathode layer and the cathode gate layer.

42 Claims, 4 Drawing Sheets

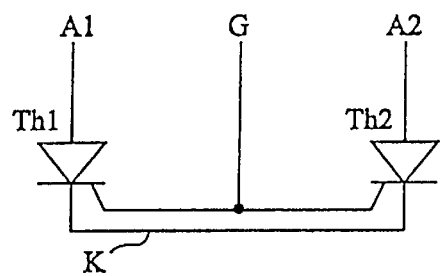
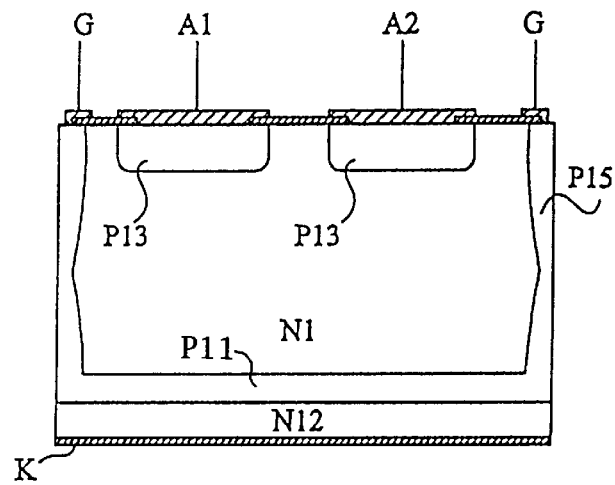
Fig 4A  Fig 4B
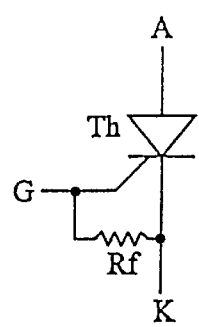
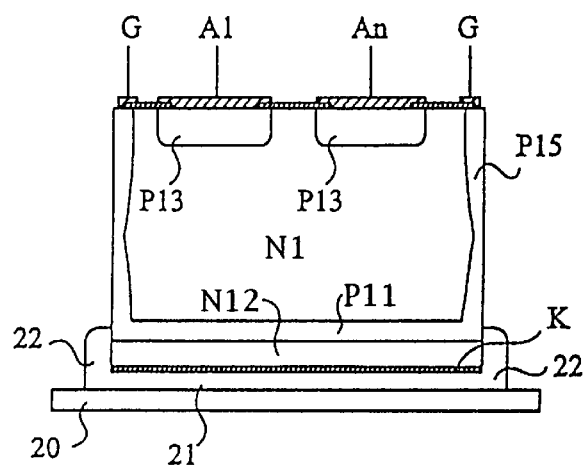
Fig 5A  Fig 5B

ASSEMBLY OF THYRISTORS HAVING A COMMON CATHODE

BACKGROUND OF THE INVENTION

1. Field of the Invention

The present invention relates to a monolithic assembly of thyristors having a common cathode and a single gate.

2. Discussion of the Related Art

Many currently-known thyristors are cathode-gate thyristors. FIG. 1A shows two such thyristors Th1 and Th2. A conventional implementation of these thyristors is schematically illustrated, in cross-sectional view, in FIG. 1B. Each thyristor is made from an N-type substrate N1, whose rear or lower surface is occupied by a P-type layer P1. On the front or upper surface side, there is a cathode-gate region P2, in which a cathode region N2 is formed. To improve the amount of voltage which the thyristor can withstand and to avoid various problems linked with slicings and brazings, the circumference of the thyristors generally is occupied by a P-type well P3, formed by drive-in from the upper and lower surfaces.

Such thyristors are well suited to common-anode assemblies. In such a case, the layers P1 of each of the thyristors are comprised of a single layer formed on the rear surface of substrate N1. This rear surface can then be mounted by brazing on a radiator.

However, some implementations of common-cathode assemblies with cathode gates raises problems. It is not desirable to perform, on the front surface, a single cathode metallization mounted on a radiator because the gate metallizations would then be short-circuited. Structures where the gate terminal is on the side opposite to the cathode surface may thus be desirable.

A first known solution is illustrated by a diagram in FIG. 2A. It consists of forming anode-gate thyristors. As shown in FIG. 2B, the structure of the thyristor is different from that shown in FIG. 1B. Still starting with an N-type substrate N1, a P-type layer P11, and then an N-type layer N12, are to be found on the rear surface of the substrate. On the front surface side, P-type anode regions P13 and a highly-doped N-type region N14 for contacting the gate are formed. A P-type well P15 connects the circumference of layer P11 to the upper surface.

An advantage of this structure is that it uses many fabrication steps which are common with the structure of FIG. 1B. Indeed, the initial steps of forming well P15 and then layer P11 are identical to the steps of forming well P3 and then layer P1 of the structure of FIG. 1B. A disadvantage of this structure is that the control is performed through a gate voltage referenced on the anode voltage, which is a high voltage when the cathode is connected to the ground. Another disadvantage is that this gate has to be negatively biased with respect to the anode whereas, in current electric circuits, it is generally easier to generate a positive control voltage than a negative control voltage. Another disadvantage is that, generally, anode-gate thyristors are less responsive than cathode-gate thyristors.

A second solution is illustrated by a diagram in FIG. 3A. It enables to improve the circuit of FIG. 2A with respect to responsiveness and also the possibility of triggering by a positive gate voltage taking the cathode, and not the anode, as a reference. In this solution, the anode gates of thyristors Th1 and Th2 are connected to the anode of a thyristor Th3, the cathode of which is connected to the common cathodes of thyristors Th1 and Th2. A connection is taken on the cathode gate to be used as the positive gate terminal G.

As shown in FIG. 3B, each of thyristors Th1 and Th2 has the same anode-cathode structure as the thyristors of FIG. 2B. The difference lies in the control structure which is comprised of a region P16 formed on the upper surface side, in which a region N17 is formed. Region N17 is connected by a wire 10 to the cathode. Region P16 is coated with a metallization connected to a gate terminal G. The disadvantage of this structure is that its surface area is large, since a significant guard distance between regions P13 (at the anode potential) and region P16 (at the cathode potential) is provided to ensure a sufficient voltage withstand. Further, the connection between a terminal of the front surface and the rear surface with a wire 10 makes the assembly more complex.

It should be noted that, in the implementations of FIGS. 2B and 3B, well P15 only has the function of protecting the circumference of the junction ensuring the forward voltage withstand capability between substrate N1 and layer P11. Indeed, this voltage withstand capability would be reduced if the junction emerged on a lateral surface. Well P15 is not connected to any terminal.

SUMMARY OF THE INVENTION

An object of the present invention is to provide an assembly of thyristors having a common cathode and a single gate avoiding the problems of prior art thyristors, this assembly being implemented by using conventional and already tested technologies.

This and other objects of the present invention are achieved by a monolithic assembly of thyristors having a common cathode and a single gate including a lightly-doped N-type substrate, a plurality of P-type anode regions, on the front surface side, covered with anode metallizations, a P-type cathode gate layer on the rear surface side of the substrate, an N-type cathode layer on the rear surface side of the P-type layer coated with a cathode metallization, a P-type well extending from the front surface to the P-type layer, a gate metallization formed on the upper surface of the P-type well, and means for increasing the leakage resistance between the cathode layer and the cathode gate layer.

According to an embodiment of the present invention, the well is circumferential.

According to an embodiment of the present invention, the well includes veins crosswise of the substrate, alternatively more or less doped, gate metallizations being formed on portions of the upper surface of the well.

According to an embodiment of the present invention, the individual thyristors are separated by insulating walls comprised of alternatively more or less doped portions, the gate metallizations being arranged on central regions of the insulating walls.

According to an embodiment of the present invention, the cathode layer extends only on part of the lower surface, and does not reach the circumference of the component.

According to an embodiment of the present invention, the component is mounted on a base, the surface of which substantially corresponds to that of the cathode layer.

According to an embodiment of the present invention, the component further includes a second external circumferential well separate from the first one.

According to an embodiment of the present invention, the cathode metallization extends only on part of the component surface and does not reach the circumference of the component.

These objects, characteristics and advantages as well as others, of the present invention, will be discussed in detail in the following non-limiting description of a specific embodiment in relation with the accompanying drawings.

BRIEF DESCRIPTION OF THE DRAWINGS

FIG. 4A shows a diagram of a circuit of a component according to an embodiment of the present invention;

FIG. 4B shows a simplified cross-sectional view of a component according to an embodiment of the present invention;

FIG. 5A shows a diagram of a thyristor;

FIG. 5B shows a conventional way of assembly applied to a thyristor according to an embodiment of the present invention;

DETAILED DESCRIPTION

Referring to FIG. 4A, an embodiment of the present invention provides an assembly of two thyristors Th1 and Th2 with a common cathode with a single gate constituting a cathode gate. In order to have a common cathode, the contact on the cathode gate is disposed on the surface opposite to the cathode.

FIG. 4B shows a simplified cross-sectional view of a component according to an embodiment of the present invention.

Figure 1A:
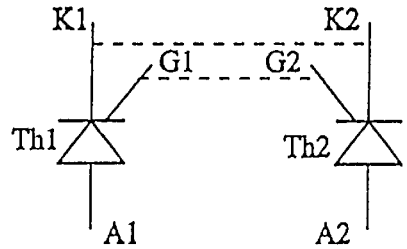
FIGS. 1A, 2A and 3A, previously described, show different diagrams of thyristor assembly circuits.
Figure 1B:
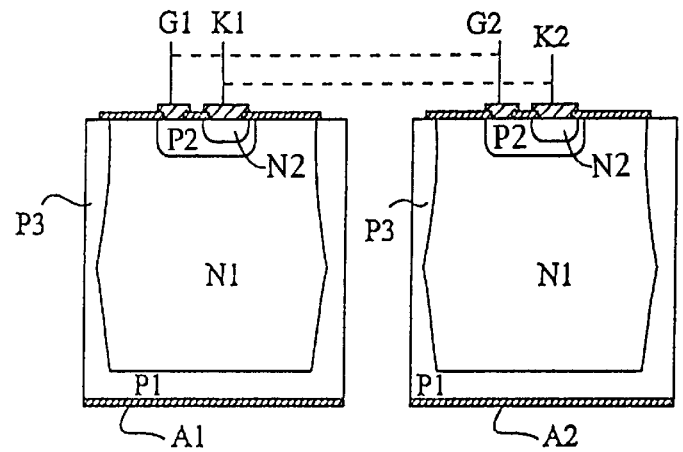
FIGS. 1B, 2B, and 3B, previously described, schematically show cross-sectional views of semiconductor components respectively implementing the circuits of FIGS. 1A, 2A, and 3A.
Figure 2A:
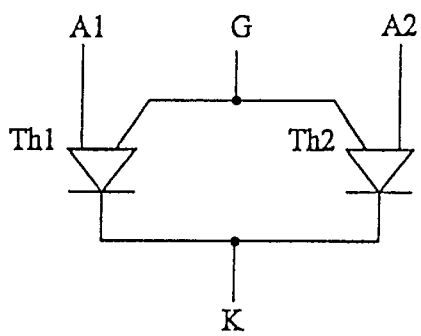
Figure 2B:
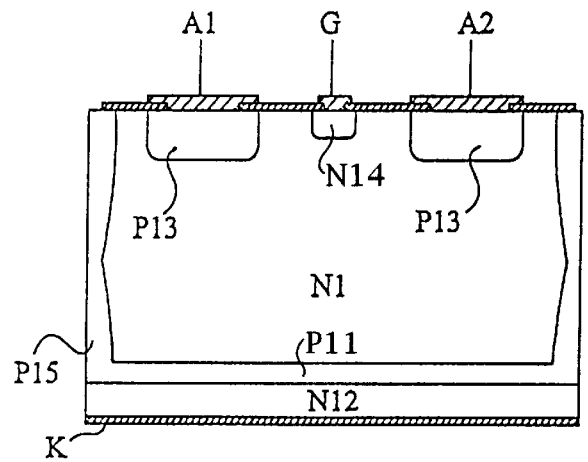
Figure 3A:
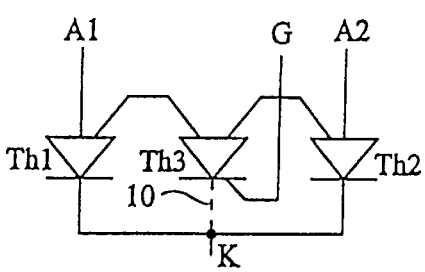
Figure 3B:
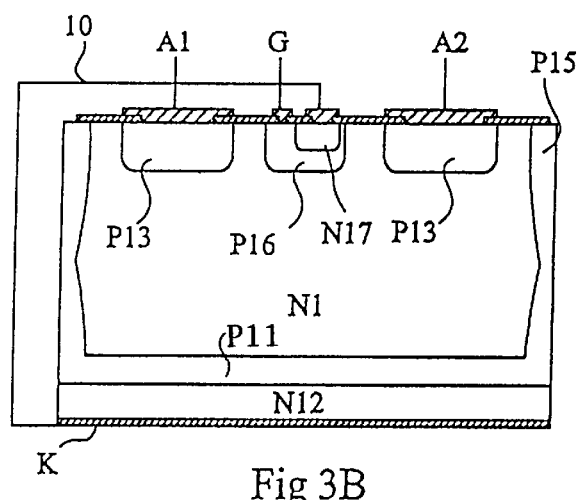

With respect to some aspects of the anode-cathode structure, this component is similar to the components of FIGS. 2B and 3B. Like these components, it has on the lower surface side of a substrate N1 a cathode gate layer P11 and a cathode layer N12 and, on the upper surface, anode regions P13. Also, the circumference of the component is surrounded with a well P15 connecting region P11 to the upper surface.

With respect to the manufacturing process, starting with substrate N11, the drive-ins for forming well P15 are first formed, after which, or possibly simultaneously, regions P11 and P13 are formed, and eventually region N12 is formed on the rear surface.

Conversely to the components of FIGS. 2B and 3B, the component according to the present invention does not necessarily include a specific gate structure. Instead, a gate contact is formed on the upper surface of well P15. Thus, the component according to the present invention has all the advantages of each of the components of FIGS. 2B and 3B without their disadvantages. Especially, it is controllable through a gate voltage which is positive with respect to the cathode voltage and its surface area can be reduced. Its responsiveness can be high since it is a cathode gate structure. Further, due to the similarity with those of FIGS. 2B and 3B, an embodiment of the invention can be manufactured in a way compatible with conventional processes.

However, the structure of FIG. 4B exhibits the risk of a defect, as described in more detail below.

In particular, FIG. 5A symbolically shows a thyristor Th. The thyristor responsiveness especially depends on the gate-cathode resistance Rf. This gate-cathode resistance corresponds to the leakage resistance between layers P11 and N12. This resistance is likely to be damaged due to two main causes. First, in the structure of FIG. 4B, the sawing of individual components from a chip where many identical components are formed breaks junction P11–N12. Such a sawing is known to damage the quality of the junction and introduce a parasitic resistance. Another source of damage for the resistance results from the conventional assembly illustrated in FIG. 5B. Cathode metallization K is mounted on a base 20, conventionally by a brazing layer 21. Now, there is a non-negligible risk for the brazing to overflow laterally at least over portions of the circumference by forming brazing overflows referred to with references 22, which causes local short-circuits of junction P11–N12. These two causes of junction damage are particularly noxious in the structure according to the invention where the gate contact is made by the well and connects to the cathode gate precisely at the locations where defects are likely to occur.

Thus, an embodiment of the present invention associates with the structure illustrated in FIG. 4B, a structure for reducing the influence of junction defects between the cathode layer and the cathode gate layer, or a structure for reducing the likeliness for such defects to occur.

According to at least one embodiment of the present invention, a particular structure of well P15 is provided.

Figure 6:
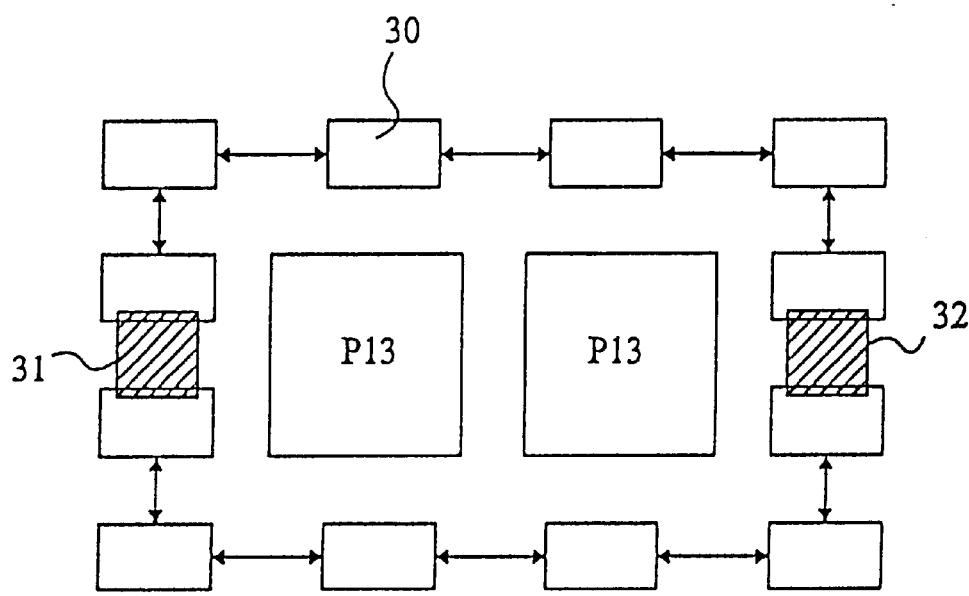
FIG. 6 shows a top view of a mask of a lateral diffusion wall used according to an embodiment of the present invention.

Instead of being formed via a continuous circumferential mask, this well is formed, as shown in FIG. 6, via a mask including neighboring apertures 30 facing the upper and lower surfaces. Thus, as the diffusion progresses across the thickness, it extends laterally and region P15 closes but thus alternately includes more or less doped vertical veins. The gate metallization is arranged in locations 31 and 32 corresponding to two thyristors Th1 and Th2. Thus, if a defect is located at the circumference of the junction between layers P11 and N12, the likeliness for this defect to be facing the vein through which the conduction to the lower layer occurs is reduced. Accordingly, in a manufacturing batch, a reduced number of devices with degraded gate responsiveness is obtained.

Figure 7A:
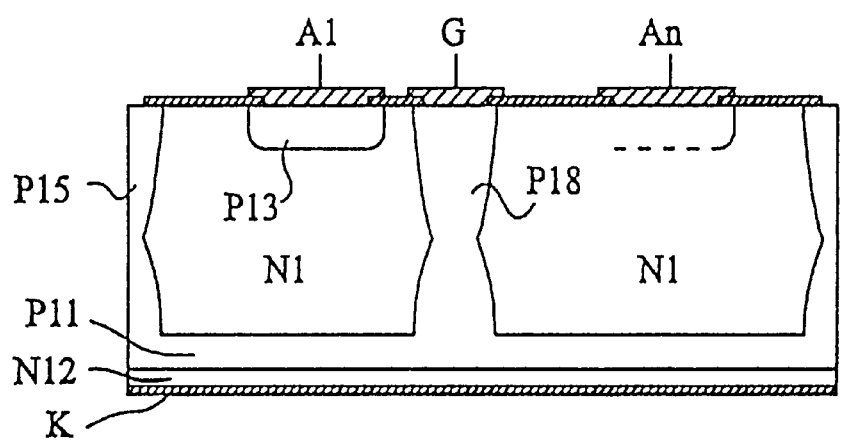
FIGS. 7A and 7B respectively show a cross-sectional view and a top view of a variant of a structure according to an embodiment of the present invention.
Figure 7B:
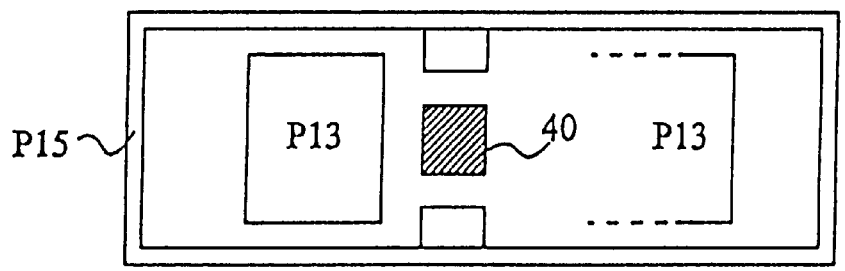

FIGS. 7A and 7B show, in cross-sectional view and in top view, an embodiment of the present invention wherein the individual thyristors are insulated by intermediary walls P18. Walls P18 may be formed discontinuously like circumferential wall P15 of FIG. 6 and a central area of these walls P18 may be coated with a gate metallization 40. Thus, this metallization can by no means be located in front of a circumferential defect and the influence of possible junction quality defects at the circumference becomes negligible.

The embodiments of FIGS. 6 and 7 overcome the influence of possible circumferential defects of the junction between layers P11 and N12. According to another embodiment of the present invention, it is sought to reduce or even suppress such circumferential defects. Examples of a structure which improves the junction circumference are illustrated in FIGS. 8 to 11.

Figure 8:
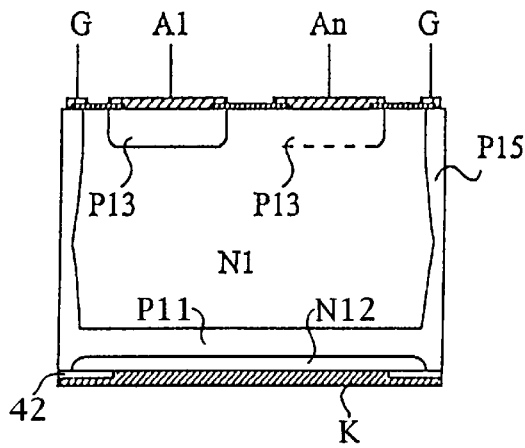
FIGS. 8 to 11 illustrate, in cross-sectional views, alternative ways of assembling a component according to an embodiment of the present invention.

In the embodiment of FIG. 8, layer N12, instead of extending over the entire lower surface, is located by a silica mask 42 and the cathode metallization is formed on this region N12. This structure has, in particular, the advantage of avoiding the occurrence of junction defects linked with the slicing. However, there still is a risk that brazing overflows short-circuit regions P11 and N12.

Figure 9:
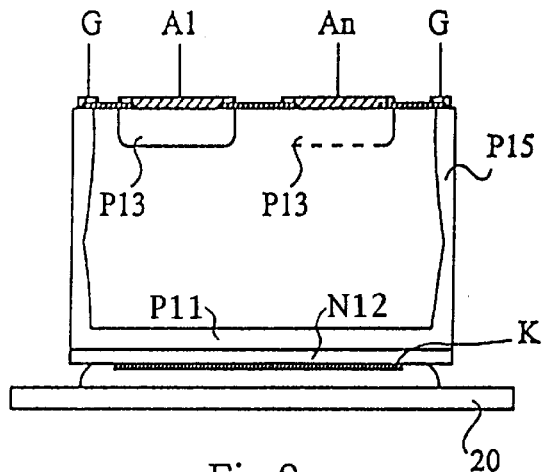

In the embodiment of FIG. 9, cathode metallization K is located at the center of the component and the risks of brazing defects are thus avoided, while, however, the defects linked with the slicing at the junction circumference remain.

Figure 10:
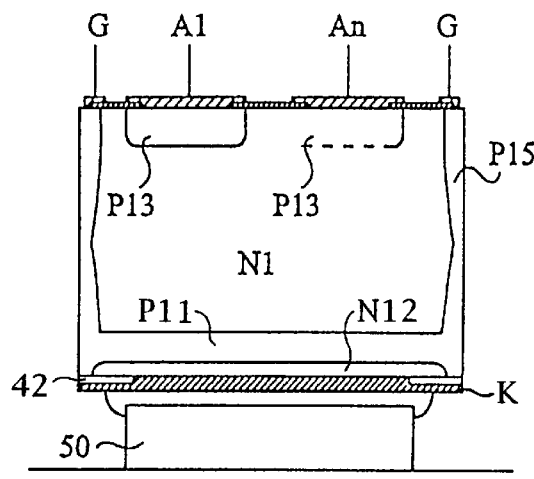

In the embodiment of FIG. 10, the cathode layer is located as in the case of FIG. 8 and a base including a projection 50 that is smaller than the lower surface of the component further is used. Thus, possible junction damage linked with the sawing or brazing overflows is avoided. This is possibly performed at a higher assembly cost.

Figure 11:
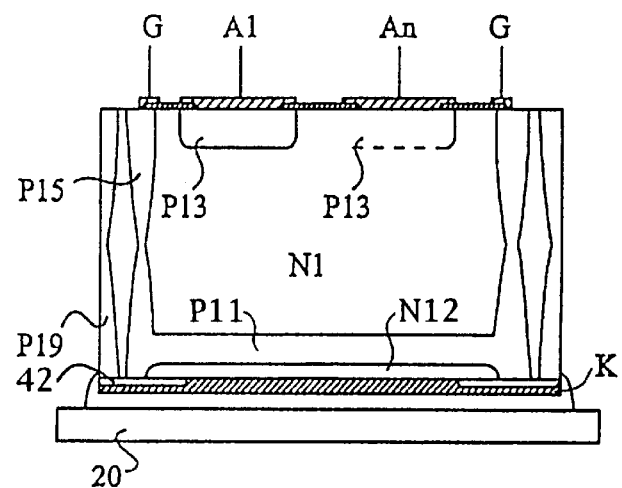

In the embodiment of FIG. 11, a double circumferential well structure is used, a well P19 being formed beyond well P15. Thus, with a localization of the cathode layer, any risk of defect linked with the sawing of the chip or brazing overflows is avoided.

Of course, the present invention is likely to have various alterations, modifications, and improvements which will readily occur to those skilled in the art. In particular, conventional improvements and alterations may be brought to the various thyristor structures, for example, the providing a transmitter short-circuits.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A semiconductor device comprising:
    a substrate having a first type of conductivity, the substrate forming a cathode at a first surface of the semiconductor device;
    a first region of a second type of conductivity formed on the substrate and extending to a second surface of the semiconductor device to form a gate of the semiconductor device, the second type of conductivity being different from the first conductivity;
    a second region of the first type of conductivity formed within the first region and extending to the second surface of the semiconductor device; and
    a plurality of wells of the second type of conductivity formed within the second region, each of the plurality of wells forming an anode at the second surface of the semiconductor device.

2. The semiconductor device of claim 1, wherein the first region extends to the second surface of the semiconductor device at a plurality of locations, the semiconductor device further comprising at least two metalization gate contacts disposed on a corresponding two of the plurality of locations.

3. The semiconductor device of claim 1, wherein the first region includes:
    a first doped region; and
    a plurality of regions each doped more heavily than the first doped region, the plurality of regions being disposed peripherally about a region occupied by the plurality of wells.

4. The semiconductor device of claim 3, further comprising at least one gate metalization contact that contacts at least two of the plurality of regions on the second surface of the semiconductor device.

5. The semiconductor device of claim 1, wherein the first region includes an intermediate region that separates a first portion of the second region from a second portion of the second region, a first one of the plurality of wells being formed within the first portion of the second region and a second one of the plurality of wells being formed within the second portion of the second region.

6. The semiconductor device of claim 5, further comprising a metalization gate contact disposed on a portion of the intermediate region that extends to the second surface of the semiconductor device.

7. The semiconductor device of claim 1, further comprising:
    a leakage resistance between the substrate and the first region; and
    means for increasing the leakage resistance.

8. The semiconductor device of claim 1, wherein the first region further extends to the first surface of the semiconductor device.

9. The semiconductor device of claim 1, wherein the first region extends to the first surface of the semiconductor device in a first area that surrounds a second area occupied by the substrate.

10. The semiconductor device of claim 9, further comprising:
    a silica mask disposed on the first area; and
    a cathode metalization contact coupled to the second area.

11. The semiconductor device of claim 10, wherein the cathode metalization contact is coupled to only an isolated portion of the substrate at the first surface of the semiconductor device.

12. The semiconductor device of claim 1, further comprising a cathode metalization contact coupled to an isolated portion of the substrate at the first surface of the semiconductor device.

13. The semiconductor device of claim 1, further comprising a third region of the second type of conductivity that surrounds the first region of the second type of conductivity.

14. The semiconductor device of claim 13, wherein:
    the first region extends to the first surface of the semiconductor device in a first area that surrounds a second area occupied by the substrate; and
    the third region extends to the first surface of the semiconductor device in a third area that surrounds the first area.

15. The semiconductor device of claim 14, further comprising:
    a silica mask disposed on the first area; and
    a cathode metalization contact coupled to only an isolated portion of the substrate at the first surface of the semiconductor device.

16. A semiconductor device comprising:
    a first thyristor including a cathode that contacts a first surface of the semiconductor device, an anode that contacts a second surface of the semiconductor device, and a cathode gate that contacts the second surface of the semiconductor device; and
    a second thyristor including the cathode of the first thyristor, the cathode gate of the first thyristor, and an anode that contacts the first surface of the semiconductor device.

17. The semiconductor device of claim 16, wherein the cathode gate extends to the second surface of the semiconductor device at a plurality of locations, the semiconductor device further comprising at least two metalization gate contacts disposed on a corresponding two of the plurality of locations.

18. The semiconductor device of claim 16, wherein the cathode gate includes:
   a first doped region; and
   a plurality of regions each doped more heavily than the first doped region, the plurality of regions being disposed peripherally about a region occupied by the anode of the first thyristor and the anode of the second thyristor.

19. The semiconductor device of claim 18, further comprising a gate metalization contact that contacts at least two of the plurality of regions on the second surface of the semiconductor device.

20. The semiconductor device of claim 16, wherein:
   the first thyristor includes a semiconductor region between the anode of the first thyristor and the cathode gate;
   the second thyristor includes a semiconductor region between the anode of the second thyristor and the cathode gate; and
   the cathode gate includes an intermediate region that isolates the semiconductor region of the first thyristor from the semiconductor region of the second thyristor.

21. The semiconductor device of claim 20, further comprising a metalization gate contact disposed on a portion of the intermediate region that extends to the second surface of the semiconductor device.

22. The semiconductor device of claim 16, further comprising:
   a leakage resistance between the cathode and the cathode gate; and
   means for increasing the leakage resistance.

23. The semiconductor device of claim 16, wherein the cathode gate further extends to the first surface of the semiconductor device.

24. The semiconductor device of claim 16, wherein the cathode gate extends to the first surface of the semiconductor device in a first area that surrounds a second area occupied by the cathode.

25. The semiconductor device of claim 24, further comprising:
   a silica mask disposed on the first area; and
   a cathode metalization contact coupled to the second area.

26. The semiconductor device of claim 25, wherein the cathode metalization contact is coupled to only an isolated portion of the cathode at the first surface of the semiconductor device.

27. The semiconductor device of claim 16, further comprising a cathode metalization contact coupled to an isolated portion of the cathode at the first surface of the semiconductor device.

28. The semiconductor device of claim 16, further comprising a second gate region that surrounds the cathode gate.

29. The semiconductor device of claim 28, wherein:
   the cathode gate extends to the first surface of the semiconductor device in a first area that surrounds a second area occupied by the cathode; and
   the second gate region extends to the first surface of the semiconductor device in a third area that surrounds the first area.

30. The semiconductor device of claim 29, further comprising:
   a silica mask disposed on the first area; and
   a cathode metalization contact coupled to only an isolated portion of the cathode at the first surface of the semiconductor device.

31. The semiconductor device of claim 1, further including a cathode metalization coupled to the cathode at the first surface of the semiconductor device.

32. The semiconductor device of claim 1, further including at least one metalization gate contact coupled to the first region at the second surface of the semiconductor device.

33. The semiconductor device of claim 16, further including a cathode metalization coupled to the cathode at the first surface of the semiconductor device.

34. The semiconductor device of claim 16, further including at least one metalization gate contact coupled to the cathode gate at the second surface of the semiconductor device.

35. A monolithic assembly of thyristors having a common cathode and a single gate, comprising:
   a lightly-doped N-type substrate;
   a plurality of P-type anode regions on a front surface side of the lightly-doped N-type substrate covered with anode metalizations;
   a P-type cathode gate layer on a rear surface side of the lightly-doped N-type substrate;
   an N-type cathode layer disposed on the rear surface side of the P-type layer, coated with a cathode metalization;
   a P-type well extending from the front surface to the P-type layer, and having an upper surface;
   a gate metalization formed on the upper surface of the P-type well; and
   means for increasing a leakage resistance between the N-type cathode layer and the P-type cathode gate layer.

36. The monolithic assembly of claim 1, wherein the P-type well is circumferential.

37. The monolithic assembly of claim 36, wherein the P-type well includes veins crosswise of the lightly-doped N-type substrate, alternatively more and less doped, gate metalizations being formed on portions of the upper surface of the P-type well.

38. The monolithic assembly of claim 37, wherein individual thyristors of the assembly of thyristors are separated by insulating walls comprised of alternatively more and less doped portions, each of the gate metalizations being arranged on a central region of a corresponding insulating wall.

39. The monolithic assembly of claim 36, wherein the cathode layer extends only on part of the rear surface side, and does not reach the circumference of the monolithic assembly.

40. The monolithic assembly of claim 39, wherein the monolithic assembly is mounted on a base, the surface of which substantially corresponds to that of the P-type cathode layer.

41. The monolithic assembly of claim 36, further comprising a second external circumferential well separate from the P-type well.

42. The monolithic assembly of claim 36, wherein the cathode metalization extends only on part of a surface of the monolithic assembly and does not reach a circumference of the monolithic assembly.

* * * * *